US009939331B2

(12) United States Patent
Silvano de Sousa et al.

(10) Patent No.: US 9,939,331 B2
(45) Date of Patent: Apr. 10, 2018

(54) SYSTEM AND METHOD FOR A CAPACITIVE THERMOMETER

(71) Applicant: Infineon Technologies AG, Neubiberg (DE)

(72) Inventors: Jonathan Silvano de Sousa, Villach (AT); Tobias Frischmuth, Vienna (AT); Peter Irsigler, Obernberg/Inn (AT); Ulrich Schmid, Vienna (AT); Thomas Grille, Villach (AT); Ursula Hedenig, Villach (AT); Sylvicley Figueira da Silva, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 870 days.

(21) Appl. No.: 14/284,198

(22) Filed: May 21, 2014

(65) Prior Publication Data
US 2015/0338285 A1 Nov. 26, 2015

(51) Int. Cl.
G01K 7/00 (2006.01)
G01K 7/34 (2006.01)
G01K 1/02 (2006.01)
B81B 3/00 (2006.01)
G01K 13/00 (2006.01)

(52) U.S. Cl.
CPC ............ *G01K 7/34* (2013.01); *B81B 3/0021* (2013.01); *G01K 1/024* (2013.01); *G01K 13/002* (2013.01)

(58) Field of Classification Search
USPC ................................ 374/163, 184
See application file for complete search history.

(56) References Cited

U.S. PATENT DOCUMENTS

| | | | |
|---|---|---|---|
| 6,229,684 B1 | 5/2001 | Cowen et al. | |
| 6,447,448 B1 | 9/2002 | Ishilkawa et al. | |
| 6,806,808 B1 * | 10/2004 | Watters | G01D 5/48 340/10.41 |
| 7,017,419 B2 | 3/2006 | Pedersen | |
| 7,353,711 B2 | 4/2008 | O'Dowd et al. | |
| 7,916,033 B2 | 3/2011 | Westrick | |
| 8,827,550 B2 | 9/2014 | Abdelmoneum et al. | |
| 2002/0154029 A1 * | 10/2002 | Watters | G01D 5/48 340/870.07 |
| 2003/0020173 A1 * | 1/2003 | Huff | B81B 7/0064 257/774 |

(Continued)

FOREIGN PATENT DOCUMENTS

| | | |
|---|---|---|
| CN | 1408120 A | 4/2003 |
| CN | 1864054 A | 11/2006 |

(Continued)

OTHER PUBLICATIONS

"Ingestible Thermometer Pill Helps Athletes Beat the Heat," National Aeronautics and Space Administration, Jan. 8, 2007, 2 pages.

(Continued)

*Primary Examiner* — Mirellys Jagan
(74) *Attorney, Agent, or Firm* — Slater Matsil, LLP

(57) ABSTRACT

Various embodiments disclosed herein include a capacitive thermometer including a deflectable membrane and a sense electrode. The deflectable membrane is configured to adjust a capacitive value based on a temperature of the deflectable membrane.

24 Claims, 10 Drawing Sheets

(56) References Cited

U.S. PATENT DOCUMENTS

| | | | |
|---|---|---|---|
| 2004/0000713 A1* | 1/2004 | Yamashita | A61B 5/0002 257/728 |
| 2007/0194913 A1* | 8/2007 | Yokoshima | A61B 5/0008 340/539.26 |
| 2007/0237204 A1* | 10/2007 | Kwon | G01K 5/02 374/163 |
| 2010/0294041 A1 | 11/2010 | Tai et al. | |
| 2011/0148584 A1 | 6/2011 | Lee et al. | |
| 2012/0176226 A1* | 7/2012 | Mackenzie | G06K 19/07749 340/10.1 |
| 2012/0206147 A1 | 8/2012 | Sim et al. | |
| 2012/0245568 A1 | 9/2012 | Yu et al. | |

FOREIGN PATENT DOCUMENTS

| | | |
|---|---|---|
| CN | 102167279 A | 8/2011 |
| JP | 2004156950 A | 6/2004 |
| KR | 1020120069722 A | 6/2012 |
| WO | 2011051504 A1 | 5/2011 |
| WO | 2013141153 A1 | 9/2013 |

OTHER PUBLICATIONS

"National Aeronautics and Space Administration," Spinoff, NASA Center for AeroSpace Information (CASI), 2006 (no date available), 10 pages.

Fonseca, et al., "Wireless Micromachined Ceramic Pressure Sensor for High-Temperature Applications," Journal of Microelectromechanical Systems, vol. 11, No. 4, Aug. 2002, 7 pages.

Lee, et al., "Antenna Circuit Design for RFID Applications," Microchip, AN710, Jan. 21, 2003, 50 pages.

Radosavljevic, et al., "A Wireless Embedded Resonant Pressure Sensor Fabricated in the Standard LTCC Technology," IEEE Sensors Journal, vol. 9, No. 12, Dec. 12, 2009, 7 pages.

Rossi, et al., "Brain temperature, body core temperature, and intracranial pressure in acute cerebral damage," Neurol Neurosurg Psychiatry 2001, Received Oct. 9, 2000, revised Apr. 18, 2001, Accepted May 20, 2001, 7 pages.

* cited by examiner

SYSTEM AND METHOD FOR A CAPACITIVE THERMOMETER

TECHNICAL FIELD

The present invention relates generally to microfabricated devices and circuits, and, in particular embodiments, to a system and method for a capacitive thermometer.

BACKGROUND

Transducers convert signals from one domain to another and are often used in sensors. One common sensor seen in everyday life is a thermometer. Various transducers exist that serve as thermometers by transducing temperature signals into electrical signals.

Microelectromechanical system (MEMS) based sensors include a family of transducers produced using micromachining techniques. MEMS gather information from the environment by measuring the change of physical state in the transducer and transferring the signal to processing electronics that are connected to the MEMS sensor. MEMS devices may be manufactured using micromachining fabrication techniques similar to those used for integrated circuits.

Further, temperature is often measured in numerous applications. Understanding temperature and how temperature changes can be useful for healthcare and diagnostics of humans and animals or for reliability and system health monitoring in manufacturing or system operation, for example. In a specific example, monitoring the temperature of a patient may be useful to healthcare professionals while monitoring metabolic responses to infection, disease, and injury. Many varieties of thermometer systems exist for use in different environments while addressing specific applications.

Such varied applications provide numerous challenges in terms of power supply, signal measurement and transmission, robustness, device life span, device positioning, and other areas, for example. Inventive concepts are desired in order to increase the usefulness and number of applications for thermometers.

SUMMARY OF THE INVENTION

Various embodiments disclosed herein include a capacitive thermometer including a deflectable membrane and a sense electrode. The deflectable membrane is configured to adjust a capacitive value based on a temperature of the deflectable membrane.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely thermometers, and more particularly, MEMS thermometers. Some of the various embodiments described herein include MEMS thermometers, capacitive thermometers, RF circuits, capacitive thermometers with RF circuits, and implantable thermometers. In other embodiments, aspects may also be applied to other applications involving any type of sensor or transducer converting a physical signal to another domain according to any fashion as known in the art.

According to various embodiments, a capacitive thermometer is disclosed. In some embodiments, the thermometer may be used without external connections or an internal power supply. Temperature information is useful in a plethora of applications; however, access to measurement points may pose some challenges. Embodiment thermometers are disclosed herein that include capacitive MEMS thermometers. Some embodiments include RF communication. The RF communication may be provided through a resistor inductor capacitor (RLC) circuit with a capacitive thermometer as the capacitor in the RLC circuit. Some embodiments include implantable thermometers arranged within a human or animal body at appropriate locations for monitoring health or related physiological changes. Other embodiments include packaged thermometers for use in other inaccessible locations, such as within chemical reactions or functioning machinery. Embodiment thermometers disclosed herein may be fabricated with a simple process and in some cases may be formed on a single semiconductor die without external connections or an internal power supply.

Figure 1:
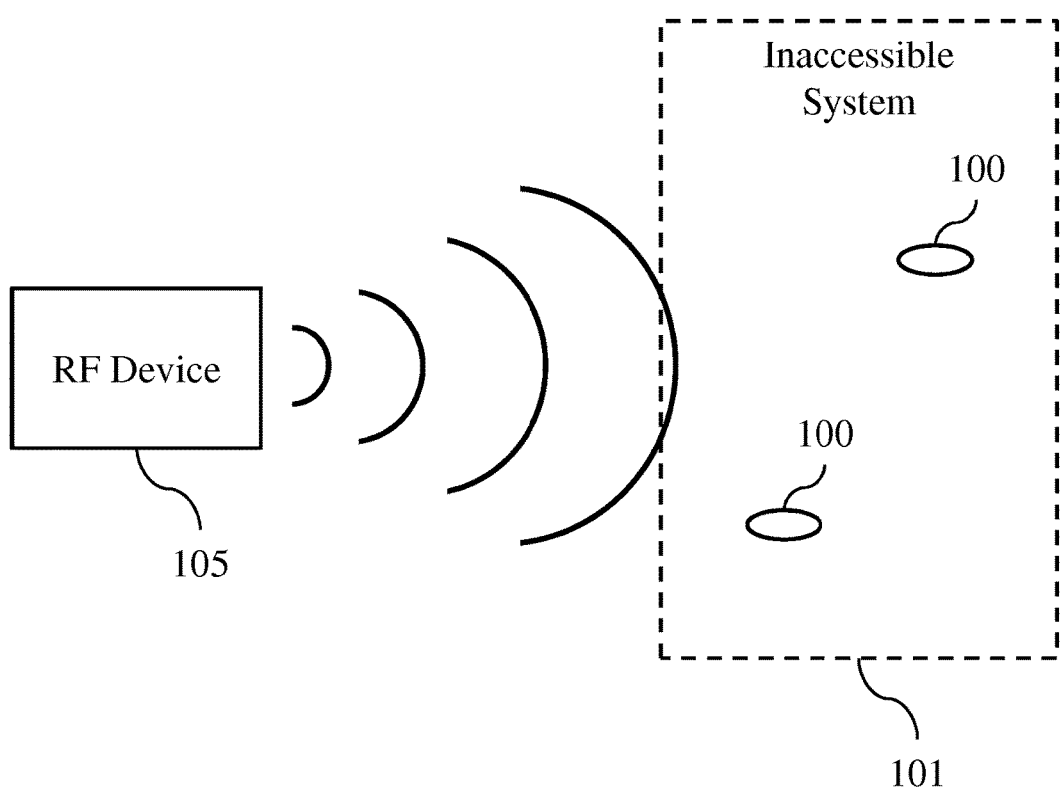
FIG. 1 illustrates a system level diagram of an embodiment system including a thermometer.

FIG. 1 illustrates an embodiment system including a thermometer 100 within an inaccessible system 101 and a radio frequency (RF) device 105 communicating with thermometer 100. According to various embodiments, inaccessible system 101 includes some type of system that is difficult to access or impossible to access due to cost and operating requirements. For example, inaccessible system 101 may include organs in a living human or animal body. In other embodiments, inaccessible system 101 includes internal positions within machinery. In various embodiments, a single embodiment thermometer 100 or a plurality of thermometers 100 are included within inaccessible system 101 in order to measure temperature at some position. In some embodiments, the position of temperature measurement is fixed. In other embodiments, the position is dynamic.

According to various embodiments, thermometer 100 does not have an internal power supply or external connections. In such embodiments, communication and power are provided wirelessly through RF device 105. As shown, RF device transmits a signal to one or more embodiment thermometers 100 within inaccessible system 101. Thermometer 100 receives the transmitted signal and generates a response signal that conveys the temperature at the respective position of thermometer 100 back to RF device 105. In various embodiments, RF device 105 may determine the temperature, or RF device 105 may be coupled to any type of processor (not shown) that determines the temperature at the respective position based on the received response signal from thermometer 100. In embodiments where more than one thermometer 100 is used, identification for each thermometer may be included. In some embodiments, each thermometer may include an RFID tag with a unique or semi-unique identification. In other embodiments, the RF characteristic of the thermometer may be different from other thermometers in the system. For example, each thermometer may have different impedance values that generate different RF responses in different frequency bands, as is described further below. In still further embodiments, each thermometer may include an integrated circuit (IC) with some controller configured to communicate and store device identification information. In such cases, the controller in the IC may use any type of communication protocol to communicate with RF device 105. In additional embodiments, thermometers 100 may also be wired devices that are placed at specific locations and communicated with through a wired connection in order to determine temperature at the specific locations.

Figure 2A:
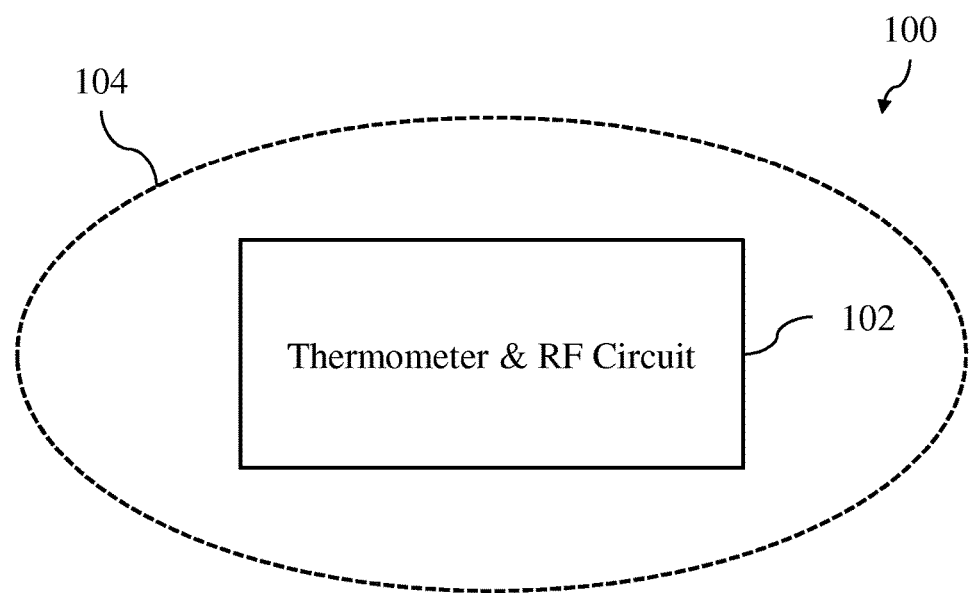
FIGS. 2a and 2b illustrate diagrams of an embodiment thermometer system.
Figure 2B:
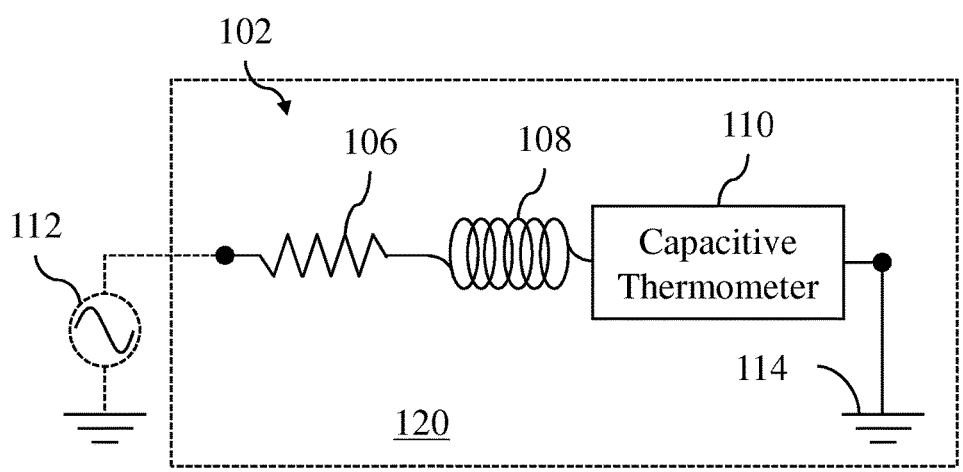

FIGS. 2a and 2b illustrate embodiment thermometer system 100 including thermometer and radio frequency (RF) circuit 102 encased in a molding compound 104. Molding compound 104 may be any material in various embodiments and may be formed in any shape around RF circuit 102. According to various embodiments of an implantable device, molding compound 104 may include any biocompatible material. Specifically, molding compound may include soda lime or borosilicate glass, for example. Further, molding compound 104 may be hermetically sealed around thermometer 102.

FIG. 2b illustrates an embodiment circuit diagram of RF circuit 102. According to various embodiments, RF circuit 102 includes resistor 106, inductor 108, and capacitive thermometer 110 attached to ground plane 114. In some embodiments, the resistor is a separate component in the circuit. In other embodiments, the resistor is a parasitic resistance in the capacitor or inductor. In some embodiments, resistor 106, inductor 108, and capacitive thermometer 110 are included on a single substrate or wafer 120, such as a silicon substrate, for example. Signal source 112 is shown to represent an RF signal transmitted to RF circuit 102 that causes excitation of the circuit.

According to various embodiments, RF device 105, as shown in FIG. 1, transmits a signal that is modeled as signal source 112. The transmitted signal excites RF circuit 102 and causes RF circuit 102 to transmit a response signal based on the RLC characteristics of RF circuit 102. The capacitance of RF circuit 102 is provided by capacitive thermometer 110. According to various embodiments, the capacitance of capacitive thermometer 110 depends on the temperature of the structure. Thus, the temperature of RF circuit 102 is conveyed in the response signal due to the dependence of the RLC characteristics of RF circuit 102 on capacitive thermometer 110. The structure of capacitive thermometer 110 is described below in reference to the other figures.

Figure 3A:
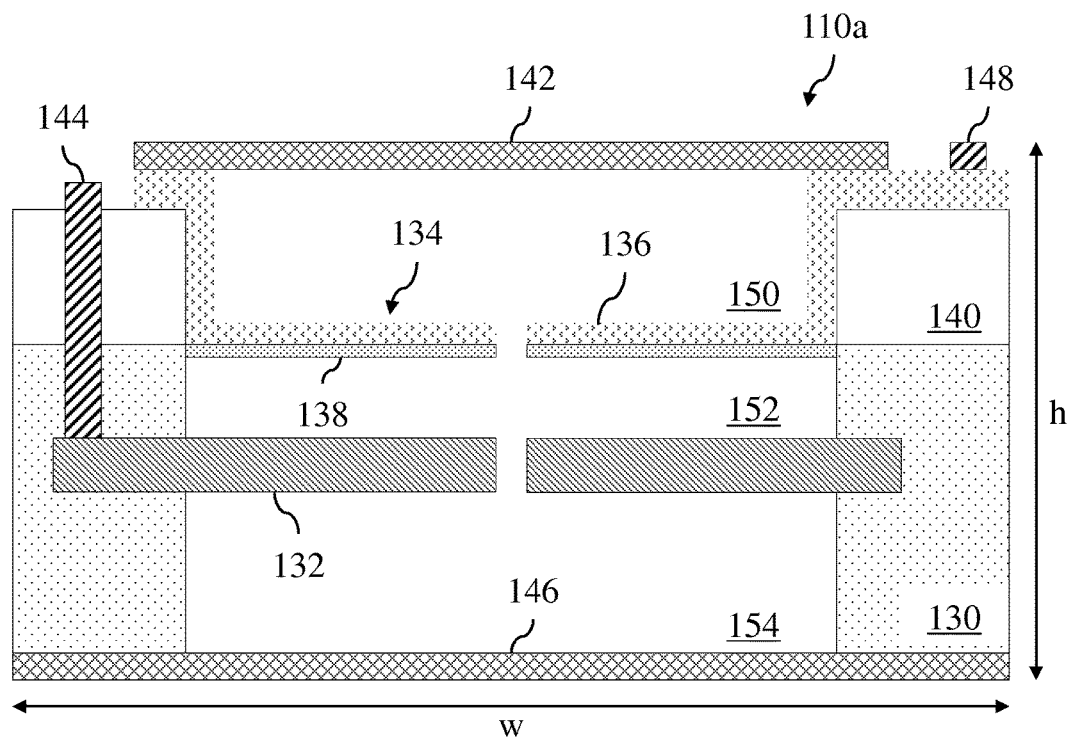
FIGS. 3a and 3b illustrate a cross-section and top view, respectively, of an embodiment capacitive thermometer.
Figure 3B:
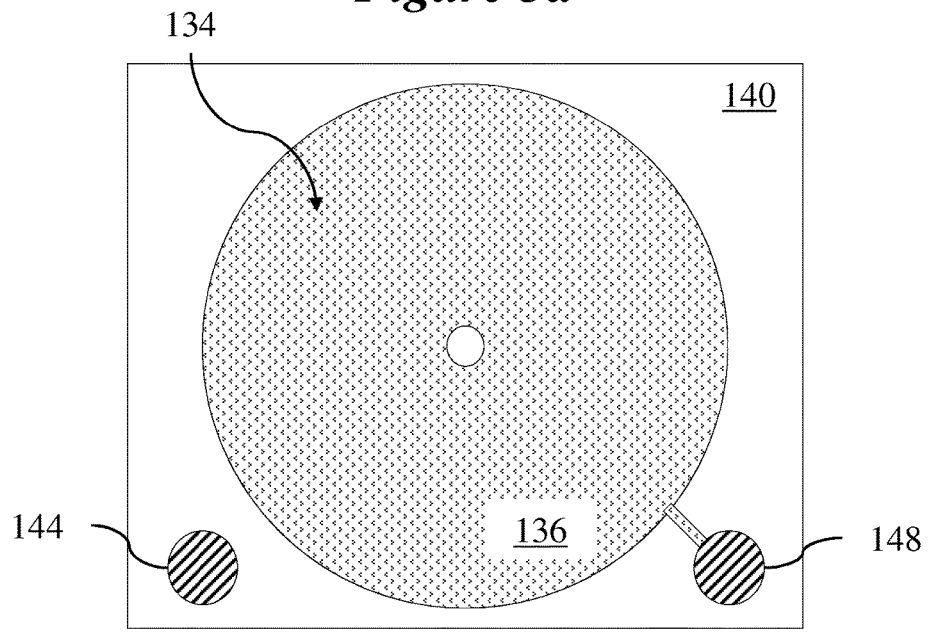

FIGS. 3a and 3b illustrate a cross-section and top view, respectively, of an embodiment capacitive thermometer 110a. According to various embodiments, capacitive thermometer 110a includes deflectable membrane 134 and rigid sense electrode 132 formed in substrate 130 and oxide 140. Cavities 150 and 152 are separated by membrane 134 and cavities 152 and 154 are separated by sense electrode 132. In various embodiments, both membrane 134 and sense electrode 132 include ventilation holes. The ventilation holes may be large enough to prevent pressure differences between cavities 150, 152, and 154. In some embodiments, either membrane 134 or sense electrode 132 may include multiple ventilation holes.

According to various embodiments, membrane 134 includes polysilicon layer 138 and aluminum layer 136. These layers include two different coefficients of thermal expansion. In such embodiments, as the temperature changes membrane 134 will deflect based on a difference in expansion or contraction rates of polysilicon layer 138 and aluminum layer 136. As membrane 134 deflects, a capacitance formed between membrane 134 and sense electrode 132 will be modified. The variation in capacitance will produce voltage or current signals between contact 144, which is coupled to sense electrode 132, and contact 148, which is coupled to aluminum layer 136 in membrane 134. Thus, the capacitance of capacitive thermometer 110a is related to temperature. In some embodiments, sense electrode 132 is formed of doped silicon.

In various embodiments, the materials used may be selected from numerous different materials. For example, contacts 144 and 148 may be formed of any conductive materials, such as a metal or doped semiconductor. Sense electrode 132 may be formed of a doped semiconductor, a metal, a metallic compound, or polysilicon, for example. Likewise, membrane 134 may be formed of two materials having two different coefficients of thermal expansion. The first material in layer 136 may also be copper, gold, platinum, or titanium, for example, and the second material in layer 138 may be silicon, doped silicon, silicon nitride, silicon oxide, silicon carbide, or other materials, for example. In some embodiments, the first material in layer 136 may be selected to have a large difference in coefficient of thermal expansion to that of the second material and also may be selected to exhibit adhesion between the first and second materials. Membrane 134 may be formed of two or more layers. In alternative embodiments, membrane 134 may be formed of a single layer. Sense electrode 132 may also be configured to deflect in response to temperature changes and may also be formed of multiple layers. In various embodiments, oxide 140 may be any oxide.

According to various embodiments, barrier layers 142 and 146 seal cavities 150, 152, and 154 from an external environment. Barrier layers 142 and 146 may be formed of a thermally conductive and non-reactive material, such as silicon oxide or other types of glass, for example. Further, in various embodiments, the maximum width w of capacitive thermometer 110a is 1 mm and the maximum height h of capacitive thermometer 110a is 400 μm. In other embodiments, width w and height h may be any dimension. In some embodiments, height h is between 100 µm and 500 µm.

FIG. 3b illustrates a top view of membrane 134. According to various embodiments, membrane 134 is a circular membrane surrounded by oxide 140 and coupled to contact 148. Contact 144 is coupled to sense electrode 132 below membrane 134. In other embodiments, membranes or sense electrodes may be formed in any shape, such as square or rectangular, for example.

Figure 4:
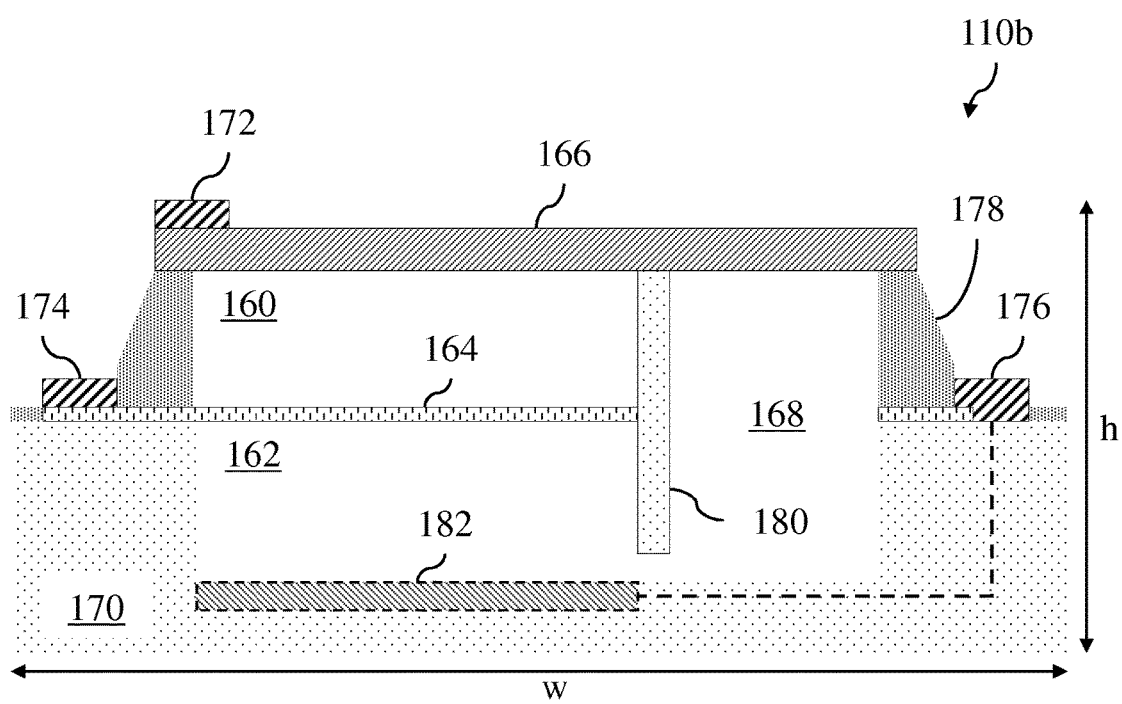
FIG. 4 illustrates a cross-section view of another embodiment capacitive thermometer.

FIG. 4 illustrates a cross-section view of another embodiment capacitive thermometer 110b including cavities 160 and 162, which are separated by membrane 164 and sealed by electrode 166. According to various embodiments, cavity 162 is formed in substrate 170. An overpressure chamber 168 is in fluid communication with cavity 162. Cavities 160 and 162 are filled with a first fluid and a second fluid. The first fluid may be argon or any noble gas and the second fluid may be an oil or alcohol, for example. In various embodiments, the first fluid and the second fluid may be in either cavity 160 or 162.

The first fluid and the second fluid may be selected to have different coefficients of thermal expansion in various embodiments. In such embodiments, when the temperature is varied in the environment surrounding and in contact with capacitive thermometer 110b, the first and second fluids in cavities 160 and 162 expand or contract by different amounts. The different amounts of expansion or contraction by the first and second fluids cause membrane 164 to deflect, changing the capacitance between electrode 166 and membrane 164 and generating a signal related to temperature on contacts 172 and 174. Thus, the capacitance of capacitive thermometer 110b is related to temperature. In other embodiments, electrode 182 may be formed below membrane 164 in substrate 170 and the capacitance changes may be measured between electrode 182 and membrane 164. Contact 176 may be coupled to electrode 182.

In various embodiments, electrode 166 is spaced from membrane 164 by patterned structural material 178. Structural material 178 may be an oxide or other structural insulator, for example. According to various embodiments, both membrane 164 and electrode 166 are formed of doped silicon and substrate 170 is a silicon substrate. In other embodiments, membrane 164 may be formed of any conductive deflectable material and electrode 166 may be formed of any conductive or semi-conductive material. Contacts 172, 174, and 176 may be formed of any conductive materials, such as a metal or doped semiconductor.

In various embodiments, overpressure chamber 168 is separated from cavity 162 by barrier 180, but fluid communication is maintained through an opening that limits or prevents overpressure situations. In some embodiments, cavities 160 and 162 are hermetically sealed.

Figure 5A:
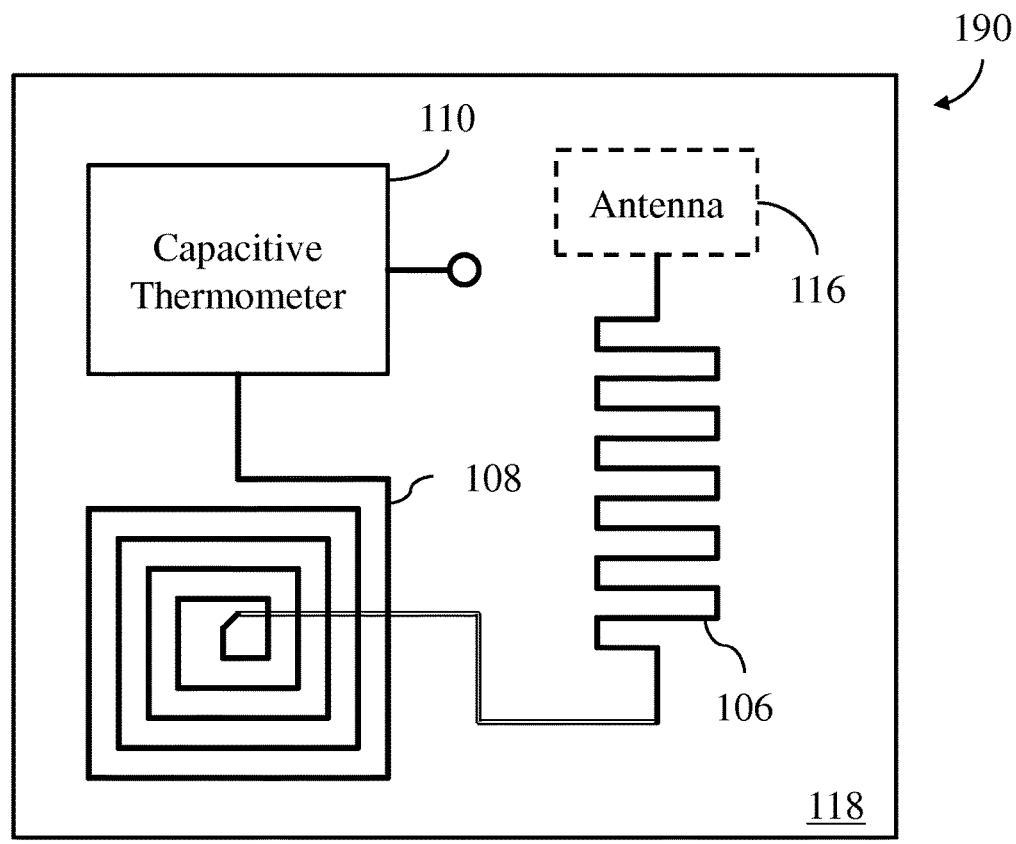
FIGS. 5a and 5b illustrate a top view and cross-section of an embodiment semiconductor system.
Figure 5B:
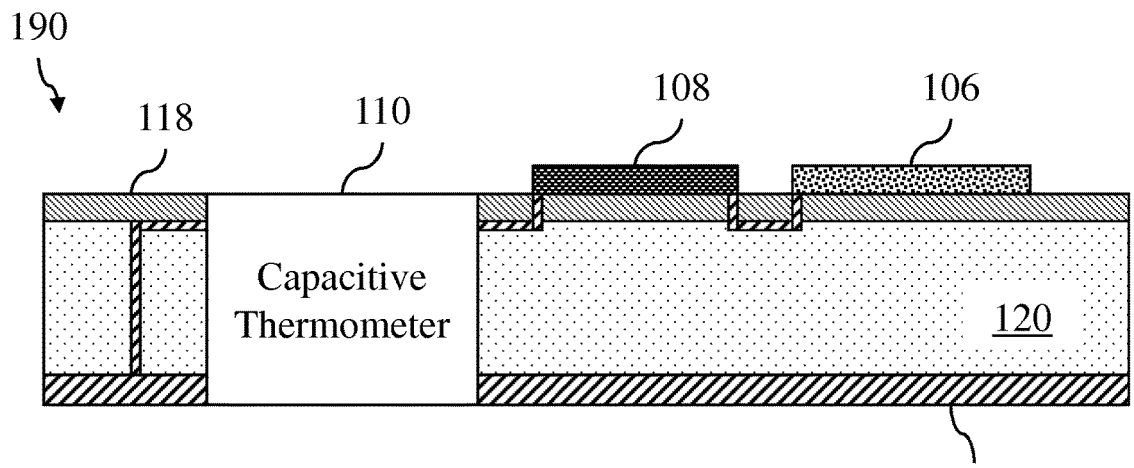

FIGS. 5a and 5b illustrate a top view and cross-section of an embodiment semiconductor system 190 including substrate 120 with capacitive thermometer 110, inductor 108, and resistor 106 formed therein. In some embodiments, insulation layer 118 is formed on top of substrate 120. According to various embodiments, capacitive thermometer 110, inductor 108, and resistor 106 form an RLC circuit as described above in reference to FIG. 2b. Inductor 108 is shown as a planar spiral inductor and resistor 106 is shown as a serpentine inductor. However, any inductor or resistor may be used as is known in the art. In various embodiments, inductor 108 may contain a ferrite core formed at its center.

According to various embodiments, inductor 108 or some form of resistor 106 may be formed as an antenna. In other embodiments, a separate antenna 116 may be included attached to resistor 106 or inductor 108. As is known in the art, many combinations of semiconductor components may be used to form an RLC circuit capable of being excited wirelessly. For example, resistor 106 may be removed and the resistance of inductor 108 may be a major source of resistance in some embodiments.

FIG. 5b illustrates a cross-section of the embodiment semiconductor die 190 including substrate 120, insulation layer 118, and ground plane 114. According to various embodiments, capacitive thermometer 110 may be formed through the entire thickness of semiconductor system 190. In other embodiments, capacitive thermometer 110 is formed only in part of the thickness of semiconductor system 190. Inductor 108 and resistor 106 may be formed on insulation layer 118 or on substrate 120 in some embodiments. Insulation layer 118 may be an oxide or other dielectric. In various embodiments, fabrication sequences for capacitive thermometer 110 include numerous fabrication steps and it is envisioned that inductor 108, resistor 106, or antenna 116 may be formed in an intermediate step of the fabrication of capacitive thermometer 110. In other embodiments, inductor 108, resistor 106, or antenna 118 may be formed on a top surface of substrate 120 before, during, or after fabrication of capacitive thermometer 110. In various embodiments, semiconductor system 190 may include a single semiconductor die, a printed circuit board (PCB), or a system on a chip (SoC). Each component may be formed separately and attached to single substrate, such as a PCB, or each component may be formed in a single semiconductor fabrication sequence on a single semiconductor die. In some embodiments, semiconductor system 190 may have a maximum length of 1 cm and a maximum width of 4 mm. In more particular embodiments, semiconductor system 190 may have a maximum length of 5 mm and a maximum width of 2 mm. Alternatively, other dimensions may be used.

Figure 6A:
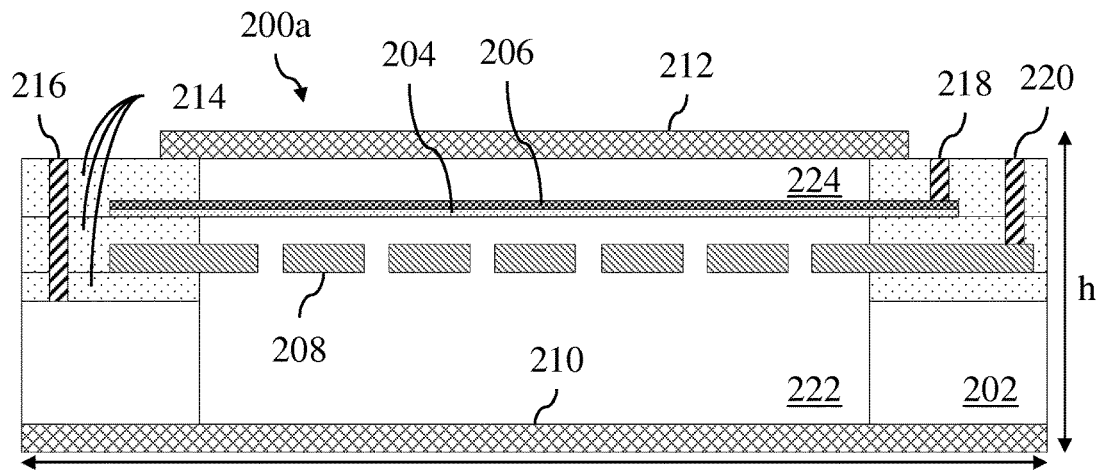
FIGS. 6a-6c illustrate cross-section views of further embodiment capacitive thermometers.
Figure 6B:
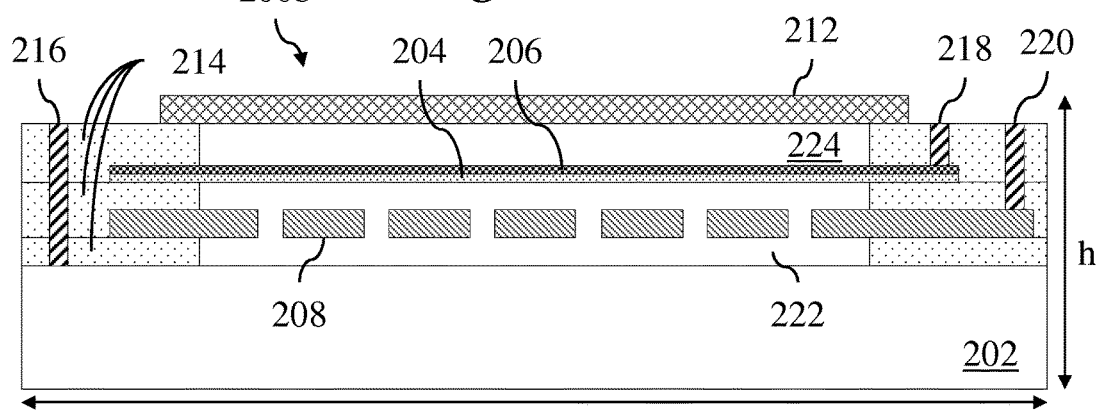
Figure 6C:
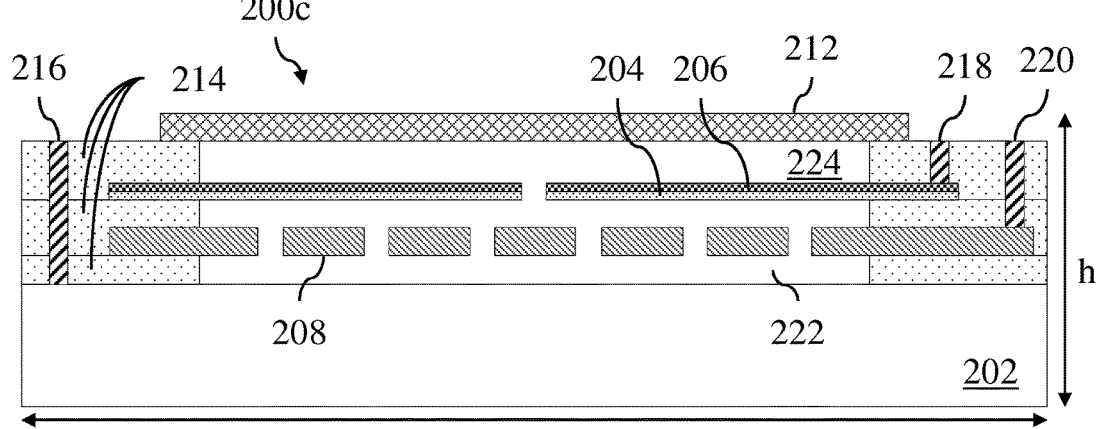

FIGS. 6a-6c illustrate cross-section views of further embodiment capacitive thermometers 200a, 200b, and 200c. According to various embodiments, capacitive thermometers 200a, 200b, and 200c are specific embodiments similar to capacitive thermometer 110a as described above in reference to FIGS. 3a and 3b. Thus, the materials, structure, and operation as described above also apply to capacitive thermometers 200a, 200b, and 200c. Specifically, capacitive thermometers 200a, 200b, and 200c may each include membranes formed of two layers 204 and 206 having different coefficients of thermal expansion. For example, layer 204 may include polysilicon and layer 206 may include aluminum. Each capacitive thermometer 200a, 200b, and 200c includes a sense electrode 208 that is offset from the membrane and senses deflection of the membrane. In each case, the membrane deflects because layers 204 and 206 expand at different rates due to the different coefficients of thermal expansion for layers 204 and 206. The sense electrode 208 may also be referred to as a backplate or counter electrode. The membrane and sense electrode 208 in capacitive thermometers 200a, 200b, and 200c are set in dielectric material 214, which is formed on substrate 202. Metallization forms contacts 216, 218, and 220 to various structures within each capacitive thermometer 200a, 200b, or 200c. In the various embodiments, the top or front side and the bottom or backside of each of capacitive thermometer 200a, 200b, and 200c may include glass layers 210 and 212 sealing the cavities 222 and 224. Glass layers 210 and 212 may seal cavities 222 and 224 by preventing fluid communication or transfer between cavities 222 and 224 and the surrounding environment. In such embodiments, preventing fluid communication may include limiting or preventing acoustic signals from exciting the membrane formed by layers 204 and 206.

According to the various embodiments, capacitive thermometer 200a illustrated in FIG. 6a includes an etched substrate 202 that undergoes a BOSCH process backside etch to form a larger cavity 202. Capacitive thermometer 200b illustrated in FIG. 6b includes a substrate 202 that does not undergo a BOSCH process backside etch and includes a smaller cavity 202. Capacitive thermometer 200c illustrated in FIG. 6c includes a substrate 202 that also does not undergo a BOSCH process backside etch. Further, capacitive thermometer 202c includes cantilevers with layers 204 and 206 that deflect in response to temperature variations, instead of a membrane as described in reference to the other figures. Capacitive thermometer 200c may include a single cantilever formed from layers 204 and 206. In other embodiments, capacitive thermometer 200c may include multiple cantilevers formed from layers 204 and 206, such as 2 or more cantilevers, for example.

Figure 7:
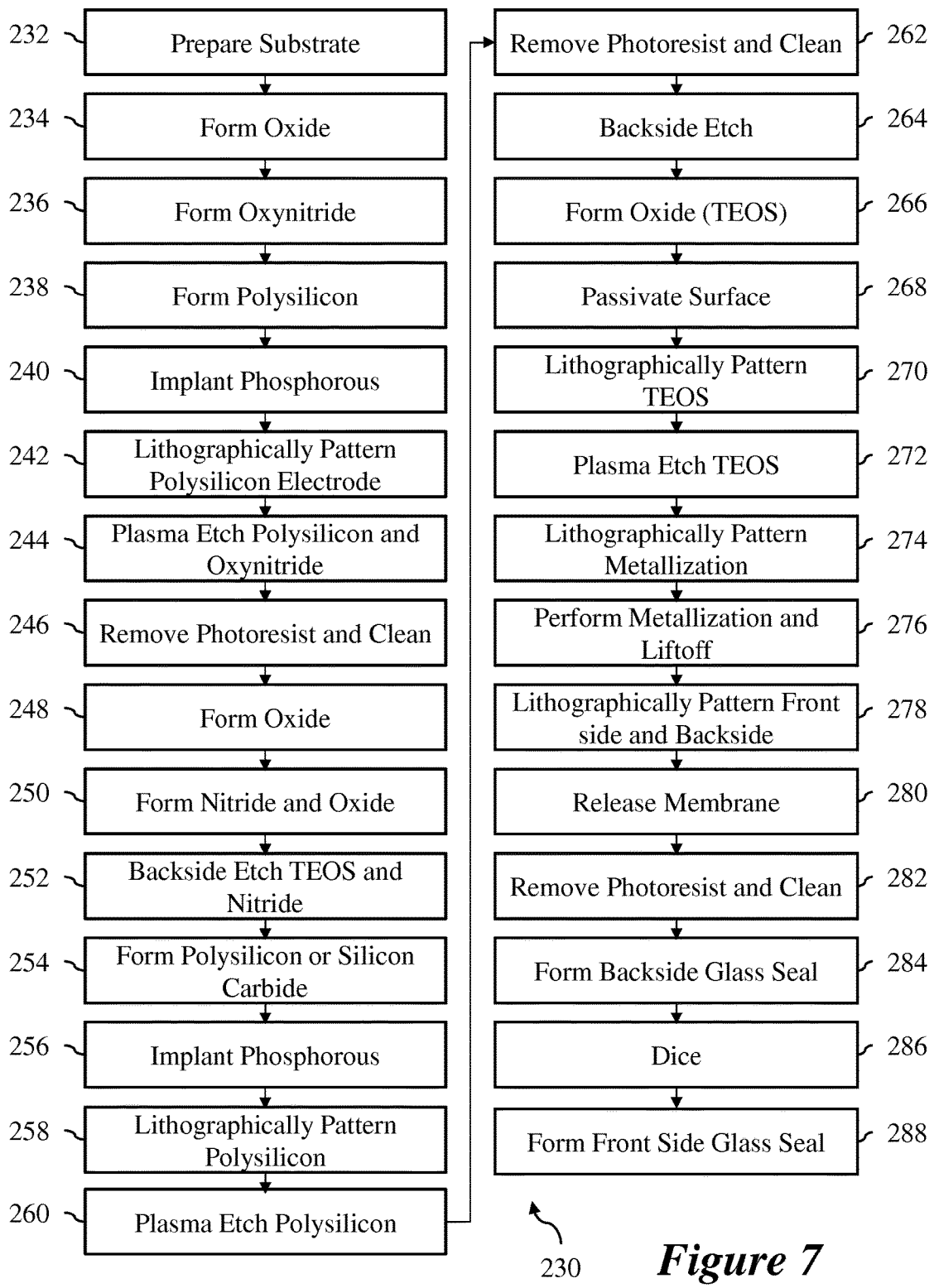
FIG. 7 illustrates a block diagram of an embodiment fabrication sequence for embodiment capacitive thermometers.

FIG. 7 illustrates a block diagram of an embodiment fabrication sequence 230 for embodiment capacitive thermometers as described herein in reference to the other figures. Generally, fabrication sequence 230 applies to capacitive thermometers 200a, 200b, and 200c as described above, but may also be applied and or modified to form any embodiment capacitive thermometers. According to various embodiments, fabrication sequence 230 includes steps 232-288.

In the various embodiments, step 232 includes providing or preparing a substrate, such as wafer including a substrate or a semiconductor substrate. Step 234 includes forming an oxide on the substrate. The oxide formed in step 234 may have a thickness of 400 to 600 nm, in one embodiment. According to various embodiments, forming a layer as described herein may include various methods of forming the layer as are known in the art. For example, forming a layer may include depositing the layer, thermally growing the layer, printing the layer, sputtering the layer, or evaporating the layer, where appropriate methods depend on the particular layer material, as is known in the art. For a further example, depositing a layer may include chemical vapor deposition (CVD) in one embodiment.

In various embodiments, step 236 includes forming an oxynitride layer on the oxide formed in step 234. In a specific embodiment, the oxynitride layer may have a thickness of 100 to 200 nm. Step 238 includes forming a polysilicon layer. The polysilicon layer may be formed on top of the oxynitride that is formed on the oxide layer. The polysilicon layer may have a thickness of 1000 to 1400 nm. Following the forming of polysilicon, step 240 may include implanting phosphorous in the polysilicon. A photoresist layer may be applied on the structure and lithographically patterned in step 242. Step 244 includes plasma etching the polysilicon layer and the oxynitride according to the patterned photoresist layer from step 242. Plasma etching the polysilicon layer forms the polysilicon layer into a sense electrode or backplate as described in reference to the other figures. The patterned polysilicon sense electrode may include ventilation holes and may be formed into a structure of any shape. Further, the oxide, oxynitride, and polysilicon layers may be formed of any other materials, as is described in reference to the other figures, for example.

Step 246 may include removing the photoresist and cleaning the wafer with a liquid rinse, for example. In various embodiments, step 248 includes forming another layer of oxide on top of the patterned polysilicon layer, oxynitride layer, and the oxide layer formed in steps 238, 236, and 234. The oxide layer formed in step 248 may have a thickness of 500-2500 nm. Step 250 may include forming a nitride layer and an oxide layer on top of the oxide layer formed in step 248. In step 250, the nitride layer may have a thickness of 100 to 200 nm and the oxide layer may have a thickness of 50 to 70 nm. In various embodiments, step 252 includes etching, on the backside of the wafer, the oxide and nitride. In various embodiments, forming an oxide layer as described herein may include using tetraethyl orthosilicate (TEOS) to form the oxide.

According to various embodiments, step 254 includes forming a membrane layer. The membrane layer may be polysilicon or silicon carbide in two embodiments. In other embodiments, the membrane layer may be any other material as described herein in reference to the other figures, for example. The membrane layer may have a thickness of 100 to 300 nm. Step 256 may include implanting phosphorous. A photoresist layer may be applied on the structure including the membrane layer and lithographically patterned in step 258. Step 260 includes patterning the membrane layer by performing a plasma etch according to the patterned photoresist layer in step 258. In various embodiments, the patterned membrane layer may include any shape of membrane with or without ventilation holes. In some specific embodiments, the patterned membrane layer includes at least one ventilation hole. In other embodiments, the membrane layer is patterned with one or many cantilevers. In various embodiments, the membrane layer is patterned over the sense electrode formed in and patterned in the earlier steps. For example, the patterned membrane may include layer 204 in FIGS. 6a-6c in some embodiments. Step 262 may include removing the photoresist and cleaning the wafer.

Step 264 includes performing a backside etch in various embodiments. The backside etch in step 264 may remove the various layers formed on the backside of the wafer during the preceding steps. Step 266 may include forming another TEOS layer and forming an oxide layer from the TEOS layer. In some embodiments, the oxide layer formed in step 266 has a thickness of 500 to 2500 nm. In various embodiments, step 268 includes passivation of the wafer surface. Passivation of the wafer surface may include forming an oxide or nitride on various layers. A photoresist layer may be applied on the structure, including the TEOS oxide layer formed in step 266, and lithographically patterned in step 270. The TEOS oxide is patterned by a plasma etch in step 272 according to the photoresist pattern formed in step 270.

According to various embodiments, step 274 includes applying and lithographically patterning a layer of photoresist for metallization. Step 276 may include forming the metallization layer on the photoresist layer formed in step 274 and performing liftoff to pattern the metallization layer. In some embodiments, the metallization layer includes layer 206 in FIGS. 6a-6c, for example. The metallization layer may be a second layer of a membrane formed over the sense electrode. In such embodiments, the membrane may include a first layer, such as of polysilicon, for example, and a second layer including the metallization layer.

In various embodiments, step 278 includes applying photoresist to the front side and backside of the wafer and lithographically patterning the photoresist layers. In some embodiments, the photoresist may be patterned to perform a BOSCH process etch. In various embodiments, the photoresist may be patterned to prepare for the membrane release. Step 280 includes releasing the membrane, which may include a polysilicon layer and a metal layer, by removing oxide adjacent the membrane layers. Step 282 includes removing the photoresist layers and cleaning the wafer after releasing the membrane in step 280.

In various embodiments, step 284 includes forming a glass layer on the backside of the wafer and sealing a first cavity adjacent to the membrane. First and second cavities adjacent the membrane may be formed during the various etch and release steps described above, which may include a BOSCH process etch in some embodiments. Step 286 may include dicing the wafer. In some embodiments, step 288 includes forming a glass layer on the front side of the wafer and sealing the second cavity adjacent to the membrane.

According to various embodiments, steps 232-288 may be modified as is known in the art. For examples, patterning steps including any type of etching steps may be used instead of lithographically patterning photoresist and plasma etching as described. Other materials may be used for any of the oxide, oxynitride, polysilicon, metal, silicon carbide, or other layers described. Further, forming a layer may include various methods known in the art. The specific thicknesses described may also include any other thicknesses outside the specified ranges in other embodiments. One of skill in the art may readily appreciate various other changes to the process flow described in steps 232-288 that are included within the scope of embodiments. For example, certain steps may be omitted, rearranged, or introduced in various embodiments.

Figure 8A:
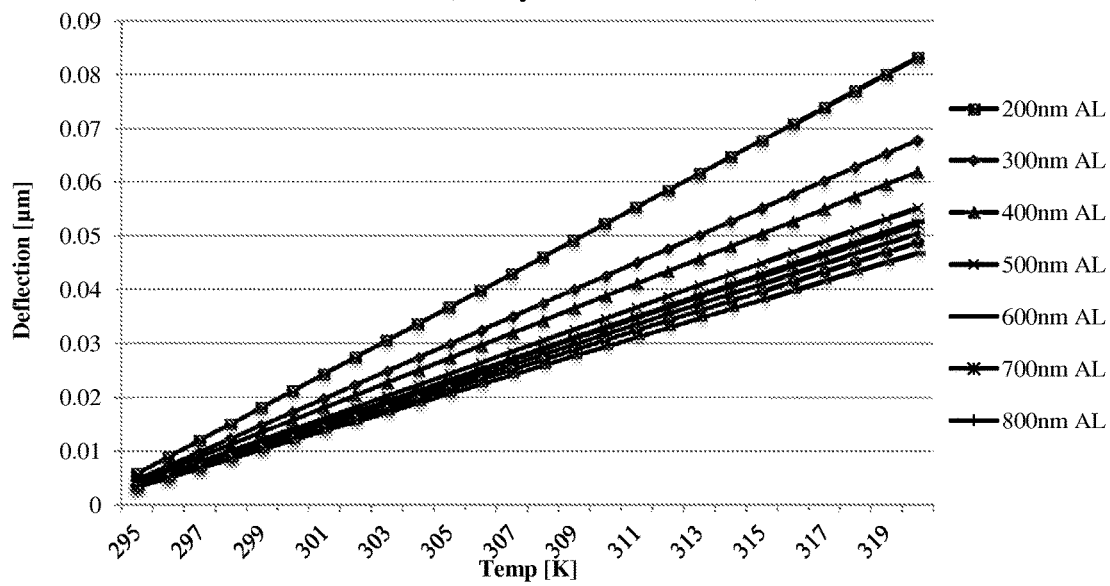
FIGS. 8a and 8b illustrate example plots showing membrane deflection for embodiment systems.
Figure 8B:
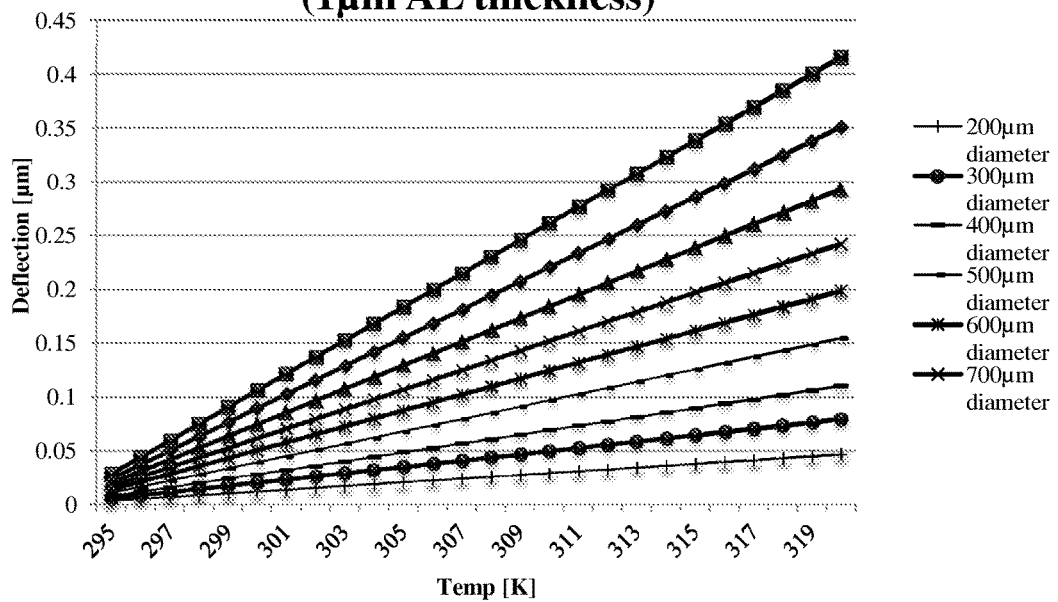

FIGS. 8a and 8b illustrate example plots showing simulated membrane deflection for embodiment systems including a single membrane layer of aluminum. In FIG. 8a, the thickness of the aluminum layer is varied for each plotted line while the diameter of the membrane is held constant at 200 μm, for example. The deflection of the membrane is plotted in micrometers versus temperature in Kelvin for aluminum thickness ranging from 200 nm to 700 nm. As shown, a larger thickness of aluminum causes lower deflection of the membrane at a specific temperature.

In FIG. 8b, the diameter of the membrane is varied while the thickness of the aluminum layer is held constant at 1 μm, for example. Again, the deflection of the membrane is plotted in micrometers versus temperature in Kelvin for membrane diameters ranging from 200 μm to 700 μm. As shown, a larger diameter of aluminum causes larger deflection of the membrane at a specific temperature.

Figure 9:
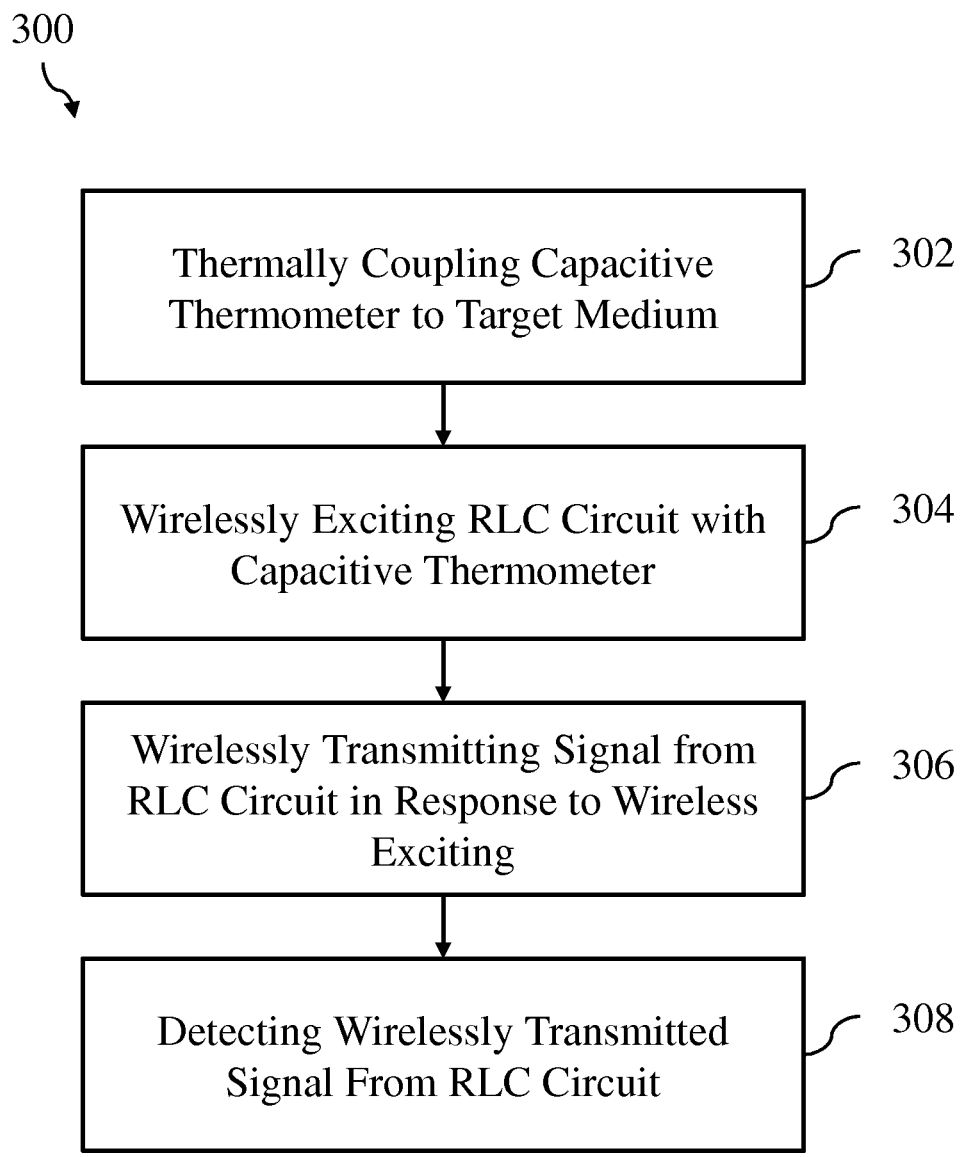
FIG. 9 illustrates a block diagram of an embodiment method of operation.

FIG. 9 illustrates a block diagram of an embodiment method of operation 300 for wirelessly determining temperature including steps 302-308. According to various embodiments, step 302 includes thermally coupling a capacitive thermometer to a target medium. Step 304 includes wirelessly exciting an RLC circuit where the capacitive thermometer includes the major capacitance. Following step 304, step 306 includes wirelessly transmitting a signal from the RLC circuit in response to the wireless exciting. Step 308 includes detecting the wirelessly transmitted signal from the RLC circuit. In some embodiments, method of operation 300 may also include determining a temperature of the medium based on the detecting. In various embodiments, the capacitive thermometer comprises a deflectable membrane and the deflectable membrane is configured to deflect based on temperature. The target medium may be an internal location of a human or animal body. In various other embodiments, other steps may be included and steps 302-308 may be performed in other orders.

Figure 10:
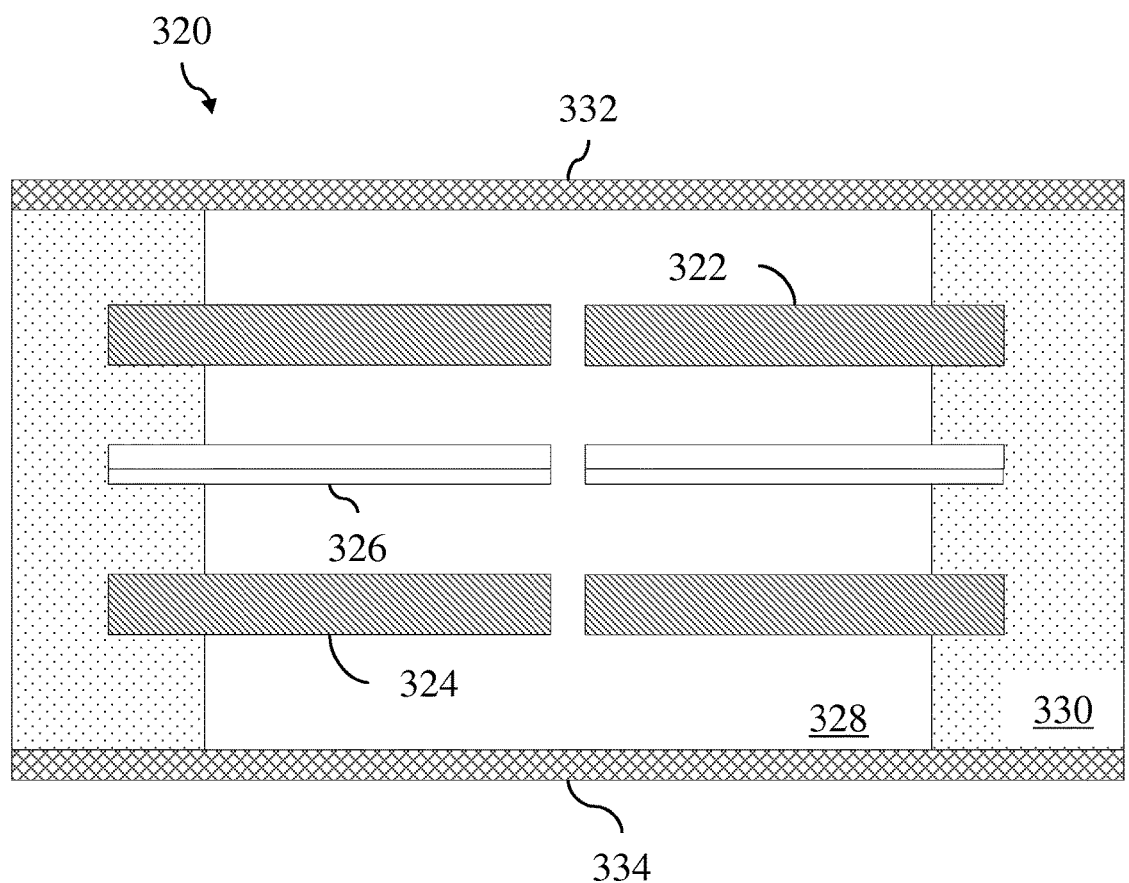
FIG. 10 illustrates a cross-section view of a still further embodiment capacitive thermometer.

FIG. 10 illustrates a cross-section view of a still further embodiment capacitive MEMS thermometer 320 including a first perforated sense electrode 322, a second perforated sense electrode 324, and a deflectable membrane 326. According to various embodiments, membrane 326 may include a bi-layer formed of aluminum and polysilicon, for example, or other materials as described hereinabove. Membrane 326, first perforated sense electrode 322, and second perforated sense electrode 324 may be formed in substrate 330 and enclosed by sealing layers 332 and 334 that are formed of glass, another biocompatible material, or other materials. In various embodiments, membrane 326, first perforated sense electrode 322, and second perforated sense electrode 324 may be coupled to other circuit components through metallization (not shown) as described further hereinabove. The various embodiments and variations described hereinabove, including the fabrication sequences and material variations, may also be applied to capacitive MEMS thermometer 320.

According to various embodiments, a circuit includes a capacitive microelectromechanical system (MEMS) thermometer including a deflectable membrane and a sense electrode. In such embodiments, the deflectable membrane is configured to adjust a capacitive value based on a temperature of the deflectable membrane.

In some embodiments, the sense electrode is a rigid sense electrode, the deflectable membrane forms a parallel plate capacitor with the rigid sense electrode, and the capacitive MEMS thermometer further includes a first thermal material with a first coefficient of thermal expansion and a second thermal material with a second coefficient of thermal expansion different from the first coefficient of thermal expansion. The first and second thermal materials are configured to cause the deflectable membrane to deflect based on the temperature of the capacitive MEMS thermometer. In various embodiments, the deflectable membrane may include the first and second thermal materials.

In some embodiments, the circuit may also include a radio frequency (RF) antenna and an inductive element coupled to the capacitive MEMS thermometer. In such embodiments, the thermometer is configured to transmit RF signals based on an inductance of the inductive element and on the capacitive value. In various embodiments, the thermometer includes no internal power supply. The deflectable membrane may separate a first cavity from a second cavity. In such embodiments, the first thermal material may be in the first cavity and the second thermal material may be in the second cavity.

In some embodiments, the capacitive MEMS thermometer may also include a first cavity containing a first fluid with a first coefficient of thermal expansion, an overpressure cavity formed adjacent to the first cavity and separated from the first cavity, the sense electrode formed as a rigid sense electrode overlying the first cavity and the overpressure cavity, a second cavity containing a second fluid with a second coefficient of thermal expansion different from the first coefficient of thermal expansion, and the deflectable membrane separating the first cavity from the second cavity. The sense electrode may be configured to seal a top opening of the first cavity and the overpressure cavity and the second cavity may be in fluid communication with the overpressure cavity. In such embodiments, the capacitive MEMS thermometer may be formed on a same substrate with an inductive element and coupled thereto. The capacitive MEMS thermometer and the inductive element may be configured to transmit a signal related to temperature when excited by a radio frequency (RF) signal.

According to various embodiments, a wireless device includes a radio frequency (RF) circuit. The RF circuit includes an inductive element and a capacitor coupled to the inductive element. In such embodiments, the capacitor includes a capacitive thermometer with a mechanically deflectable membrane configured to adjust a capacitive value proportionally to a change in temperature.

In some embodiments, the wireless device is configured to receive all power and communication signals wirelessly. In an embodiment, the wireless device has no internal power supply. The wireless device may also include a package encasing the capacitive thermometer and the RF circuit. The package may include a biocompatible material and the wireless device may be implantable in human or animal bodies.

In some embodiments, the radio frequency (RF) circuit is coupled to a ground plane on the wireless device. In various embodiments, the wireless device has a maximum length of 1 cm and a maximum width of 4 mm. The capacitive thermometer may be a microelectromechanical system (MEMS) thermometer. In such embodiments, the MEMS thermometer may include a rigid sensing electrode, the deflectable membrane forming a parallel plate capacitor with the rigid sensing electrode, a first thermal material with a first coefficient of thermal expansion, and a second thermal material with a second coefficient of thermal expansion different from the first coefficient of thermal expansion. The first and second thermal materials may be configured to cause the deflectable membrane to deflect based on the temperature of the MEMS thermometer. In an embodiment, the RF circuit is disposed on a single semiconductor substrate.

According to various embodiments, a capacitive thermometer includes a first cavity, a second cavity formed beneath the first cavity, a third cavity formed beneath the second cavity, a deflectable membrane separating the first cavity from the second cavity, a first perforated sense electrode separating the second cavity from the third cavity, a first protective layer formed over the first cavity and sealing the first cavity, and a second protective layer formed beneath the third cavity and sealing the third cavity. In such embodiments, the deflectable membrane includes a first material with a first coefficient of thermal expansion and a second material with a second coefficient of thermal expansion different from the first coefficient of thermal expansion. The deflectable membrane includes a ventilation hole and the electrode is separated from the membrane by a separation distance and is capacitively coupled to the membrane.

In some embodiments, the capacitive thermometer is formed on a same substrate with an inductive element and coupled thereto. The capacitive thermometer and the inductive element may be configured to transmit a signal related to temperature when excited by a radio frequency (RF) signal. In an embodiment, the perforated sense electrode is configured to deflect based on a change in temperature.

In some embodiment, the capacitive thermometer may also include a second perforated sense electrode separated from the membrane in a direction opposite the first perforated sense electrode. The capacitive thermometer may include a capacitive microelectromechanical system (MEMS) thermometer. In further embodiments, the capacitive thermometer may include additional cavities formed below or above the first, second, and third cavity.

According to various embodiments, a method of wirelessly determining temperature includes thermally coupling a capacitive thermometer to a target medium, wirelessly exciting an RLC circuit, wirelessly transmitting a signal from the RLC circuit in response to the wireless exciting, and detecting the wirelessly transmitted signal from the RLC circuit. In such embodiments, the capacitive thermometer is the major capacitance of the RLC circuit.

In some embodiments, the method also includes determining a temperature of the medium based on the detecting. The capacitive thermometer may include a deflectable membrane that is configured to deflect based on temperature. In an embodiment, the target medium is an internal location of a human or animal body.

Various advantages of embodiments disclosed herein include a tiny wireless thermometer that may be included in numerous locations without external connections or an internal power supply or power storage mechanism such as large discrete capacitors or batteries. Embodiment thermometers may be implanted in human or animal bodies or internally in other inaccessible systems. Some embodiment capacitive MEMS thermometers may be used for measuring the temperatures in chemical reactions in simple or complex processes. Other capacitive MEMS thermometers may be distributed throughout oil or gas pipelines for system monitoring. Still further capacitive MEMS thermometers may be used in various mechanical systems such as in the aviation and automotive industries for vehicle health or operation monitoring.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a capacitive microelectromechanical system (MEMS) thermometer comprising a deflectable membrane and a sense electrode, wherein the deflectable membrane is configured to adjust a capacitive value based on a temperature of the deflectable membrane, wherein
the sense electrode comprises a rigid sense electrode,
the deflectable membrane forms a parallel plate capacitor with the rigid sense electrode,
the capacitive MEMS thermometer further comprises
a first thermal material with a first coefficient of thermal expansion, and
a second thermal material with a second coefficient of thermal expansion different from the first coefficient of thermal expansion, wherein the first and second thermal materials are configured to cause the deflectable membrane to deflect based on the temperature of the capacitive MEMS thermometer, and
the deflectable membrane comprises the first and second thermal materials.

2. The circuit of claim 1, further comprising a radio frequency (RF) antenna and an inductive element coupled to the capacitive MEMS thermometer, wherein the thermometer is configured to transmit RF signals based on an inductance of the inductive element and on the capacitive value.

3. The circuit of claim 2, wherein the thermometer comprises no internal power supply.

4. A circuit comprising:
a capacitive microelectromechanical system (MEMS) thermometer comprising a deflectable membrane and a sense electrode, wherein the deflectable membrane is configured to adjust a capacitive value based on a temperature of the deflectable membrane, wherein the capacitive MEMS thermometer comprises:

a first cavity containing a first fluid with a first coefficient of thermal expansion;
an overpressure cavity formed adjacent to the first cavity and separated from the first cavity,
the sense electrode formed as a rigid sense electrode overlying the first cavity and the overpressure cavity, wherein the sense electrode is configured to seal a top opening of the first cavity and the overpressure cavity, and
a second cavity containing a second fluid with a second coefficient of thermal expansion different from the first coefficient of thermal expansion, wherein the second cavity is in fluid communication with the overpressure cavity, the deflectable membrane separating the first cavity from the second cavity.

5. The circuit of claim 4, wherein the capacitive MEMS thermometer is formed on a same substrate with an inductive element and coupled thereto.

6. The circuit of claim 5, wherein the capacitive MEMS thermometer and the inductive element are configured to transmit a signal related to temperature when excited by a radio frequency (RF) signal.

7. A wireless device comprising:
a radio frequency (RF) circuit, the RF circuit comprising:
an inductive element; and
a capacitor coupled to the inductive element, wherein the capacitor comprises a capacitive thermometer with a mechanically deflectable membrane configured to adjust a capacitive value proportionally to a change in temperature.

8. The wireless device of claim 7, wherein the wireless device is configured to receive all power and communication signals wirelessly.

9. The wireless device of claim 7, wherein the wireless device comprises no internal power supply.

10. The wireless device of claim 7, wherein the radio frequency (RF) circuit is coupled to a ground plane on the wireless device.

11. The wireless device of claim 7, wherein the wireless device has a maximum length of 1 cm and a maximum width of 4 mm.

12. The wireless device of claim 7, wherein the RF circuit is disposed on a single semiconductor substrate.

13. The wireless device of claim 7, further comprising a package encasing the capacitive thermometer and the RF circuit.

14. The wireless device of claim 13, wherein the package comprises a biocompatible material and the wireless device is implantable in human or animal bodies.

15. The wireless device of claim 7, wherein the capacitive thermometer comprises a microelectromechanical system (MEMS) thermometer.

16. The wireless device of claim 15, wherein the MEMS thermometer comprises:
a rigid sensing electrode;
the deflectable membrane forming a parallel plate capacitor with the rigid sensing electrode;
a first thermal material with a first coefficient of thermal expansion; and
a second thermal material with a second coefficient of thermal expansion different from the first coefficient of thermal expansion, wherein the first and second thermal materials are configured to cause the deflectable membrane to deflect based on the temperature of the MEMS thermometer.

17. The wireless device of claim 16, wherein the deflectable membrane comprises the first and second thermal materials.

18. A capacitive thermometer comprising:
a first cavity;
a second cavity formed beneath the first cavity;
a third cavity formed beneath the second cavity;
a deflectable membrane separating the first cavity from the second cavity, the deflectable membrane comprising a first material having a first coefficient of thermal expansion and a second material having a second coefficient of thermal expansion different from the first coefficient of thermal expansion, wherein the deflectable membrane comprises a ventilation hole;
a first perforated sense electrode separating the second cavity from the third cavity, wherein the electrode is separated from the membrane by a separation distance and is capacitively coupled to the membrane;
a first protective layer formed over the first cavity and sealing the first cavity; and
a second protective layer formed beneath the third cavity and sealing the third cavity.

19. The capacitive thermometer of claim 18, wherein the perforated sense electrode is configured to deflect based on a change in temperature.

20. The capacitive thermometer of claim 18, further comprising a second perforated sense electrode separated from the membrane in a direction opposite the first perforated sense electrode.

21. The capacitive thermometer of claim 18, wherein the capacitive thermometer comprises a capacitive microelectromechanical system (MEMS) thermometer.

22. The capacitive thermometer of claim 18, further comprising additional cavities formed below or above the first, second, and third cavity.

23. The capacitive thermometer of claim 18, wherein the capacitive thermometer is formed on a same substrate with an inductive element and coupled thereto.

24. The capacitive thermometer of claim 23, wherein the capacitive thermometer and the inductive element are configured to transmit a signal related to temperature when excited by a radio frequency (RF) signal.

* * * * *